United States Patent [19]

Béjot et al.

[11] 4,419,625
[45] Dec. 6, 1983

[54] DETERMINING ASYNCHRONOUS MOTOR COUPLE

[75] Inventors: Emile Béjot, Carros; Adriano Filiaggi, Antibes, both of France

[73] Assignee: La Telemecanique Electrique, France

[21] Appl. No.: 213,251

[22] Filed: Dec. 5, 1980

[51] Int. Cl.³ ...................... G01R 21/00; G01R 31/00
[52] U.S. Cl. ............................ 324/142; 324/158 MG; 361/23
[58] Field of Search ....................... 324/142, 158 MG; 364/483; 322/99; 318/490; 361/23

[56] References Cited

U.S. PATENT DOCUMENTS 2,448,533 9/1948 Laurance ............................ 324/142

Primary Examiner—Ernest F. Karlsen

Attorney, Agent, or Firm—William A. Drucker

[57] ABSTRACT

A device determines the mean power absorbed from a current supply by measuring the current in a phase, and the voltage between two phases, determining the product thereof, and integrating the product.

A first potentiometer provides a proportion of the voltage which is an image of the current, and subtracts it from that voltage between phases. A second potentiometer provides a proportion of the voltage between phases and subtracts if from the product. A third potentiometer provides a proportion of a constant voltage and subtracts it from that product. The third potentiometer is adjusted so that the output power of the integrator shall be zero when the motor rotates under no-load condition.

12 Claims, 2 Drawing Figures

DETERMINING ASYNCHRONOUS MOTOR COUPLE

The invention has for its object a device for the determination of the couple provided by an asynchronous electric motor.

BACKGROUND OF THE INVENTION

It is applicable more particularly to the detection of overloads and/or of underloads of asynchronous motors, for their surveillance and/or for the protection of mechanical installations equipped therewith, or to the regulation of the couple.

PRIOR ART

The known methods (measurement of $\phi$ or of cos $\phi$; measurement of the speed of the motor) are not very reliable and do not give a faithful picture of the couple on the shaft, independently of variations of the feed supply.

OBJECT OF THE INVENTION

The invention proposes to determine the couple provided by the machine by measuring, by a known method, the power absorbed from the supply and by deducting therefrom the whole of the losses, that is to say: losses by Joule effect in the windings of the stator; iron losses in the magnetic circuits of the stator; mechanical losses and other no-load losses (the iron losses of the rotor being considered to be negligible).

SUMMARY OF THE INVENTION

According to the invention the measuring device which carries out this determination comprises means for determining the mean power absorbed from the supply by measuring of the current in a phase and of the voltage between two phases and integration of the product, and is characterised by first means for subtracting from the said product, before the said integration, a quantity which is a function of the square of the said current; second means for subtracting from the said product, before the said integration, a quantity which is a function of the said voltage, and third means for subtracting from the said product, before the said integration, a quantity such that, when the motor rotates under no-load conditions, the resultant of the said integration shall be nil.

According to a preferred embodiment, the device further comprises fourth means for subtracting, from the resultant of the said integration, a fraction of the said resultant which is variable as a function of time according to an exponential law.

The first means subtract, from the power absorbed from the supply, the Joule losses of the stator, the second means subtract therefrom the iron losses, and the third means the no-load losses, whilst the fourth means correct the effect of the others and take into account the increase of Joule losses due to the heating of the windings in the course of operation of the motor.

BRIEF DESCRIPTION OF THE DRAWINGS

Other features, as well as the advantages of the invention, will appear clearly in the light of the detailed description which follows.

In the accompanying drawing.

DESCRIPTION OF THE PREFERRED EMBODIMENT

Figure 1:
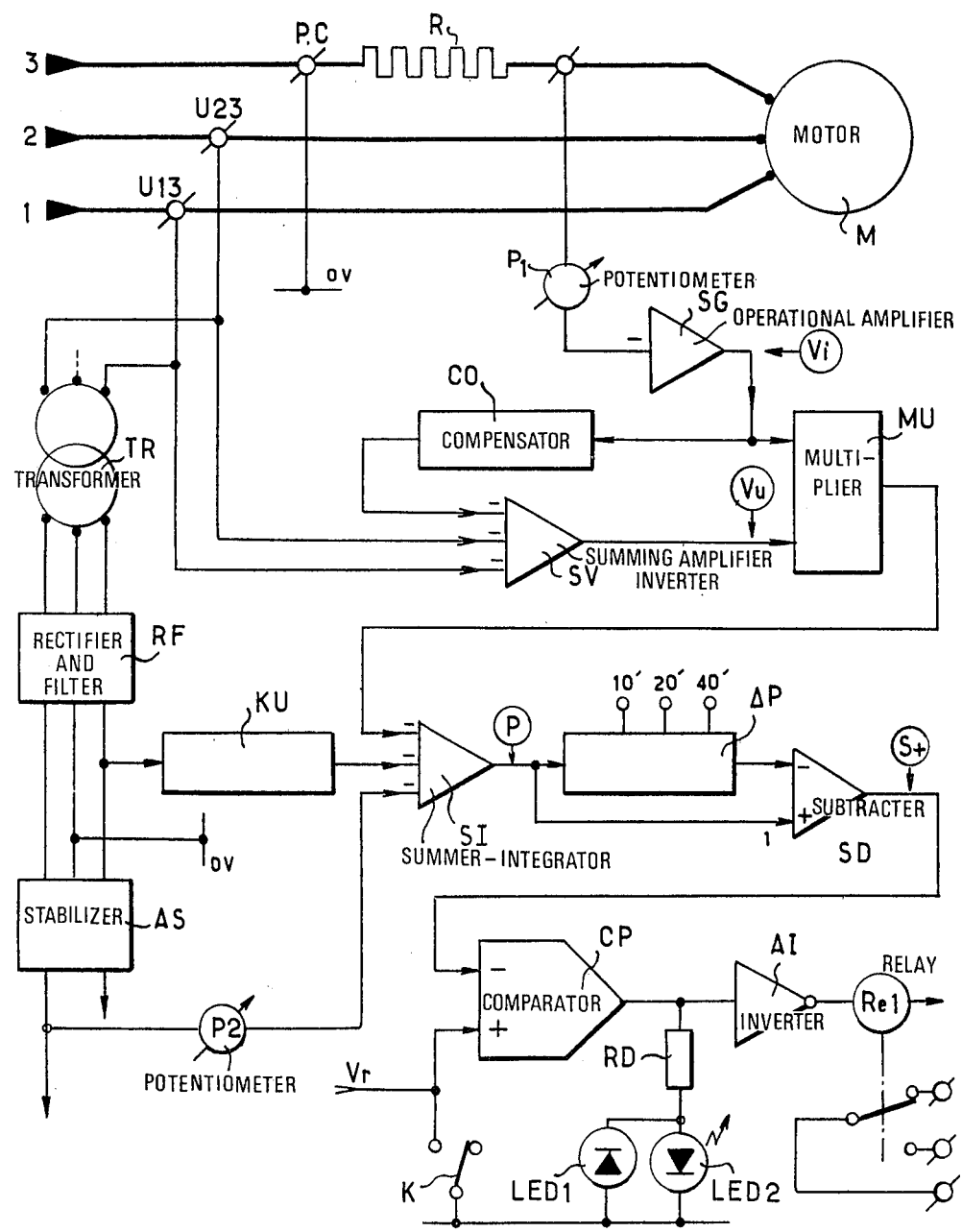
FIG. 1 shows schematically a device for the determination of the couple of an asynchronous motor according to a preferred manner of construction of the invention and associated with threshold members providing surveillance.

In FIG. 1 there is shown a motor M of the asynchronous three-phase cage type. At the terminals of a resistance R there is taken off a voltage which is an image of the current on a phase 3. This voltage is applied, by means of a gain adjusting potentiometer $P_1$, to an operational amplifier SG connected in inverter state, the output of which is coupled to an input of a multiplier MU. The other input of this multiplier is coupled to the output of a summation-inverter SV having three inputs. A first input of SV is coupled to the output of SG by means of a compensator device CO which injects into SV a fraction of the output voltage of SG, the function of which will be explained later herein. A second input is coupled to phase 1. The common point (OV) is taken on phase 3, which permits the application on the second input of the voltage $U_{23}$ and, on the third input, of the voltage $U_{13}$.

At the output of SV there would be obtained, in the absence of injection at the first input of SV of a fraction of the output voltage of SG, an image $-V_u \sin \omega t$ of three times the simple voltage, whilst at the output of SG there is an image: $-V_i \sin(\omega t - \phi)$ of the current I in the remaining phase, $\phi$ being the displacement of the phase of the current with respect to the voltage.

By integrating the product provided by MU of these two image voltages in a summator-inverter SI there will thus be obtained, in accordance with a method which is moreover known per se, a voltage proportional to the active power absorbed $V_i \cdot V_u \cdot \cos \phi$.

$P_1$ adjusts the gain of SG to take account of the fact that the current will be able to vary for example between 0.5 A and 5 A, and to set to scale.

The compensator device CO, suitable for a circuit of the invention and which is advantageously a potentiometer, permits to take into account losses by Joule effect in the windings of the stator. In effect, a fraction of the output voltage of SG, proportional to I, becomes reinjected into MU, thus multiplied by I, and it is finally a quantity proportional to $I^2$ which is subtracted from the active power absorbed. The output of MU is injected into a first input of an operational amplifier SI arranged as a summator-integrator.

According to another feature, the circuit described has, apart from its first input coupled to the output of MU, a second input coupled to a compensation device KU and a third input coupled to a potentiometer $P_2$.

The device KU is fed by the voltage U between the phases 1 and 2, taken off by means of a transformer TR and smoothed and filtered at RF. This voltage, after stabilisation by a circuit AS, serves as a stabilised feed to the various elements of the circuit, including the potentiometer $P_2$.

The device KU provides either a voltage proportional to U (it then acts as a simple potentiometer) or a more complex function of U (voltage at $U^n$ for example), according to whether or not the variations of the supply are, or are not, sufficient for passing out of the state of saturation of the magnetic circuits for the stator. This correction voltage compensates for iron losses in the said circuits.

The potentiometer $P_2$ subtracts from the power collected at the output of SI a quantity that is adjusted in order to obtain, as will be explained in the following, a nil output power when the motor rotates in no load condition in such a manner as to compensate for the mechanical losses (and other no load losses). This compensation remains good when the motor is under load; nevertheless, as the mechanical losses can develope slowly, it is necessary to readjust from time to time this "mechanical zero", by making use of the adjustment of $P_2$.

The output of Si is directly coupled to the positive input of a subtractor SD and it is coupled to the negative input of SD by means of a compensation device $\Delta P$ which injects therein a fraction $\Delta P$ of the ouput power $P$ of SI, which fraction is variable with time according to an exponential law. The output S of the subtractor is thus $P-\Delta P$.

The importance of this compensation is as follows:

When the motor is cold, the resistance $R_o$ of the windings of the stator has a relatively low value and the compensation provided by CO, intended to take into account the Joule effect losses, is excessive. As, and to the extent that, the motor heats up, the resistance of the windings increases and it is therefore necessary to provide a supplementary compensation.

Figure 2:
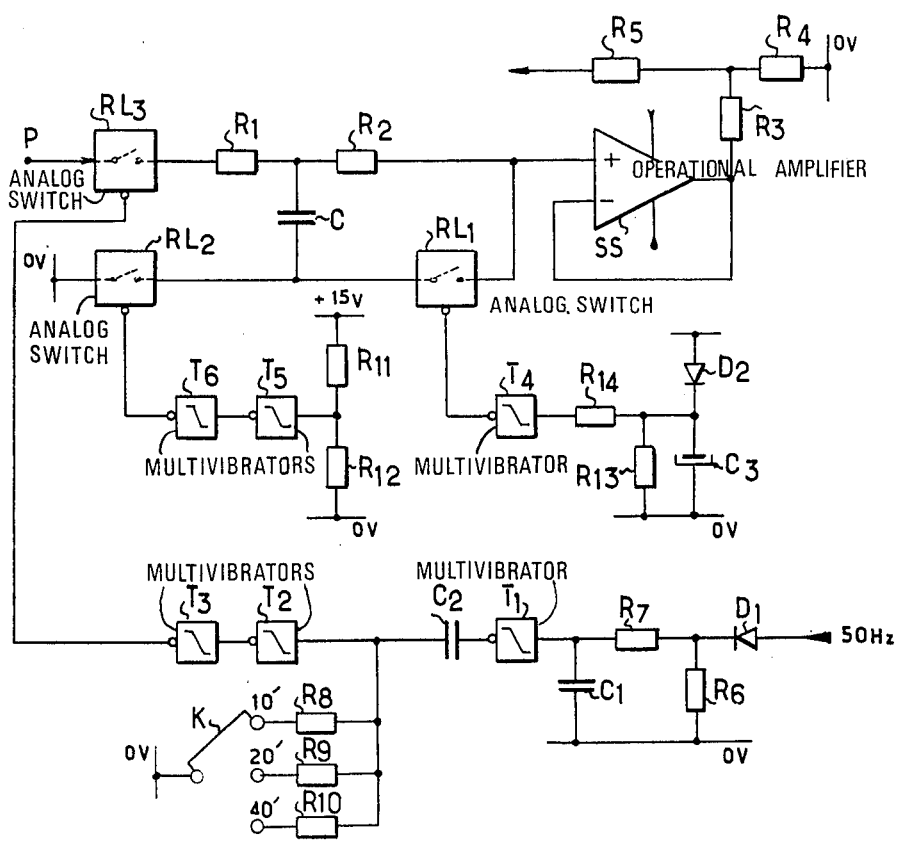
FIG. 2 is a circuit diagram of a preferred method of construction of the fourth means referred to above.

The circuit $\Delta P$, of which a preferred embodiment will be described with reference to FIG. 2, provides a voltage $\Delta P = KP(1-e^{-t/RC})$, RC being a time constant of long duration, programmable by the user, by steps of 10 mn for example (terminals marked 10', 20' and 40'), K being a coefficient of proportionality comprised between 0 and 1.

There will now be explained how there is obtained the adjustment of "mechanical zero" mentioned above.

The output of the subtractor SD is coupled to an input of a threshold comparator CP the other input of which receives a reference voltage $V_r$. The output of CP is coupled, on the one hand, to the input of an inverter AI the output of which controls a relay Re[1] intended to signal an overload for example, and on the other hand by means of a resistance $R_D$ to two photo-emitter diodes $LED_1$, $LED_2$ connected head to tail. A switch K permits the connection to earth or to the reference voltage of the positive input of CP.

When the switch K is closed, CP tilts to the region of a nil voltage applied at its negative input. An appropriate adjustment is made to the potentiometer $P_2$ to obtain the threshold of change of lighting of the two diodes when the motor rotates at no load.

It is clear that, in normal operation of the motor, the output of SD represents the image of the couple provided by the motor (active power absorbed less the losses).

When the switch K is open, CP transmits to AI the extents of exceeding of the designed value (defined by $V_r$) of the couple of the motor. The circuit described thus carries out a surveillance of the operation of the motor.

In FIG. 2 there is shown a circuit for the charging of a condenser C by the output voltage of the summator-inverter SI of FIG. 1, through an analog switch $RL_3$ and a resistance R. The charge of this condenser is transmitted, by a resistance $R_2$, to the positive input of an operational amplifier SS the negative input of which is coupled to the output. This latter feeds the negative input of the subtractor SD of FIG. 1 through a divide-by-twenty bridge constituted by resistances $R_3, R_4$ and $R_5$.

The positive input of SS is coupled to earth by means of two analog switches $RL_1$ and $RL_2$, the common point of which is coupled to that terminal of the condenser C which is not coupled to the resistances $R_1, R_2$.

The analog switch $RL_3$ receives closure control pulses, generated from the 50 Hz supply, by rectification of an alternating voltage by means of a diode $D_1$, then filtered (so far as concerns parasitics of the supply) by a circuit composed of two resistances $R_6 - R_7$ and a condenser $C_1$. A multivibrator $T_1$ transforms the rectified positive half-waves provided by this circuit into rectangular pulses having a width corresponding to a duration of 10 ms. These pulses are differentiated by a circuit comprising a condenser $C_2$ and one of the resistances $R_8$, $R_9$, $R_{10}$ according to the position 10', 20' or 40' of a selector switch K coupled to earth.

As a result there is generation of impulses corresponding to the rising fronts of the pulses and of a duration adjustable between about 30 to about 200 $\mu$s. These pulses are shaped by two multivibrators $T_2$ and $T_3$.

In case of cutting of the supply, a reservoir condenser (not shown), normally charged by the stabilised feed (AS, FIG. 1) provides a voltage of 15 volts.

The analog switch $RL_2$, normally closed when the supply is present (so that C then has an electrode at earth) is opened upon cutting of the supply, under the control of the voltage (marked $+15$ V in the drawing) provided by the reservoir condenser, taken off from a divider bridge $R_{11}, R_{12}$ and shaped by two multivibrators $T_5$ and $T_6$. As a result the condenser C can now not discharge itself into the amplifier SS, the latter is now not fed, and such a discharge must be avoided.

Upon placing the device under normal voltage, a condenser $C_3$ is charge through a diode $D_2$. In case of cutting of the supply, $C_3$ discharges into a resistance $R_{13}$, in a time of the order of 70 seconds, at the end of which a steep front, shaped by a multivibrator $T_4$, closes the analog switch $RL_1$ which is normally open. As a result, the condenser C discharges through $RL_1$ into the resistance $R_2$ (of a value much less than $R_1$). The time constant of 70 seconds permits the condenser C to retain a memory of the heating if a closely spaced halting and restarting of the installation are necessary.

In normal operation, the condenser C charges for the duration of the pulses applied to $RL_3$, across $RL_3$, the resistance $R_1$ and $RL_2$ (then closed). Between two pulses, the condenser C practically retains its charge, SS having an impedance at its input which is very large, and $RL_1$ being open, so that no discharge path exists. It finally results that the time constant of charging of C is much greater than that which would be determined by the product $R_1 C$. (it is 10,20 or 40 mn in the example described.)

The amplitude of the voltage at the terminals of C is measured by the amplifier SS, which plays the part of a follower and divider by twenty; that is to say, the fraction $\Delta P$ finally varies exponentially between the limits 0 and 5% of P.

The practical construction of the circuit illustrated in FIGS. 1 and 2 is within the skill of the man in the art. By way of example, SS will be an operational amplifier with field effect transistor, model LF 13741N; SD will be a differential amplifier with unit gain, model LM 301A; CP will be an operational amplifier, model LM 301A; SG will be an operational amplifier, model LM 301A; SV will be an operational amplifier, model LM 301A, playing the part of a summator-inverter; SI will be an operational amplifier, model LM 301A, playing the part of a summator and semi-integrator; MU will be a four quadrant multiplier constituted by the energy circuit RC 4200A of the "Raytheon" Company, $RL_1$ and $RL_3$ can be constituted by bidirectional static relays constituted by integrated circuits CMOS 4016.

It will be clear that various modifications will be able to be made in the circuit described and shown, without exceeding the scope of the invention.

We claim:

1. A device for the determination of the couple provided by an asynchronous motor, said device comprising:
    (i) means for determining the mean power absorbed from a polyphase current supply, said means including means for measuring the current in a phase, means for generating a single phase voltage from a combination of the voltages between the respective phases, means for deriving the product of the said current and single phase voltage, means for determining the mean value of the said product; and
    (ii) means for subtracting from said product, before said determination of the mean value thereof, a quantity which is a function of the said current, and which substantially represents the losses in the motor.

2. A device as claimed in claim 1, wherein the said quantity is proportional to the square of the said current and provided by first means.

3. A device as claimed in claim 1, in which said subtracting means further include second means for subtracting from the said product, before said determination of the mean value thereof, a quantity which is a function of the said single phase voltage.

4. A device as claimed in claim 1, wherein said subtracting means further include third means for subtracting from said product, before said determination of the mean value thereof, a quantity which is selected such that, when the motor rotates under no-load conditions, the said mean value is zero.

5. A device as claimed in claim 1, wherein said subtracting means further comprises fourth means for subtracting from said mean value a fraction of said means value which is variable as a function of time in accordance with an exponential law.

6. A device as claimed in claim 5, wherein said fourth means comprise a condenser which is charged, through a resistor by a voltage which is representative of the said mean value for the duration of periodic pulses, at the supply frequency, applied to a first analog switch connected in series with said resistor.

7. A device as claimed in claim 6, said device further comprising second and third analog switches which respectively couple that terminal of the condenser, not coupled to the first analog switch, to earth and, through a further resistor, to the other terminal of the condenser, said second analog switch being normally open and being closed after a predetermined delay from the interruption of the supply.

8. A device as claimed in claim 2, said device comprising a first potentiometer coupled to the said means for measuring the current in a phase, a multiplier device for effecting the said product, and means for subtracting, at the input of the said multiplier device, the output voltage of the said first potentiometer from the said single phase voltage.

9. A device as claimed in claim 3, said device including a multiplier device for effecting the said product wherein said second means comprise a second potentiometer fed by the said single phase voltage and means for subtracting in a subtractor-integrator device, which determines the said value, a function of the said single phase voltage from the product provided by the said multiplier device.

10. A device as claimed in claim 4, said device including a multiplier device for effecting the said product, wherein said third means comprise a third potentiometer, which provides a fraction of a constant voltage, and wherein there are provided means for subtracting in a subtractor-integrator device, which determines the said mean value, the said voltage from the product provided by the said multiplier device.

11. A device as claimed in claim 5, wherein the said mean value is corrected by the action of the said four means is compared with earth potential in a comparator device provided at its output with means for indicating zero value of said corrected mean value.

12. A device as claimed in claim 11, wherein said comparator device is adapted to compare the said corrected mean value with a reference voltage.

* * * * *